United States Patent [19]

Shearin

[11] Patent Number: 4,827,267
[45] Date of Patent: May 2, 1989

[54] HIGH AVAILABILITY SOLID STATE MODULATOR FOR MICROWAVE CROSS-FIELD AMPLIFIERS

[75] Inventor: Thayer L. Shearin, Woodland Hills, Calif.

[73] Assignee: ITT Gilfillan, Van Nuys, Calif.

[21] Appl. No.: 122,739

[22] Filed: Nov. 19, 1987

[51] Int. Cl.⁴ .............................................. G01S 7/28
[52] U.S. Cl. .................................. 342/201; 342/202; 330/43; 331/82
[58] Field of Search ...................... 342/201, 202, 200; 328/65, 67; 315/277; 330/43; 331/82; 307/262

[56] References Cited

U.S. PATENT DOCUMENTS

| | | | |
|---|---|---|---|
| 3,361,992 | 1/1968 | Massey | 331/81 |
| 3,697,799 | 10/1972 | Caldwell et al. | 330/43 X |
| 3,768,038 | 10/1973 | Anzai et al. | 328/65 X |
| 3,932,820 | 1/1976 | Damon et al. | 330/43 |
| 4,042,837 | 8/1977 | Nyswander | 328/65 X |
| 4,160,214 | 7/1979 | Colin et al. | 328/65 |
| 4,482,816 | 11/1984 | Richardson et al. | 328/65 X |

Primary Examiner—T. H. Tubbesing
Assistant Examiner—Mark Hellner
Attorney, Agent, or Firm—Robert A. Walsh; Thomas N. Twomey; Mary C. Werner

[57] ABSTRACT

A solid state radar transmitter pulse modulator system capable of generating high power operating pulses having pulse width and pulse repetition rate agility and being programmable for output pulse current over a substantial range of peak current values to produce corresponding values of transmitter output power. A multi-stage cascade cross-field amplifier (CFA RF chain) is employed, each stage having its own pulse modulator comprised of one or more standard modules paralleled at the output to drive the corresponding CFA stage provides fail-soft operation. Means are included for protecting solid state circuits in the event of CFA or other component failures, for dynamically matching CFA and pulse transformer impedances, and for preventing BH curve "walk-up" during operation.

7 Claims, 11 Drawing Sheets

MODULE BLOCK DIAGRAM

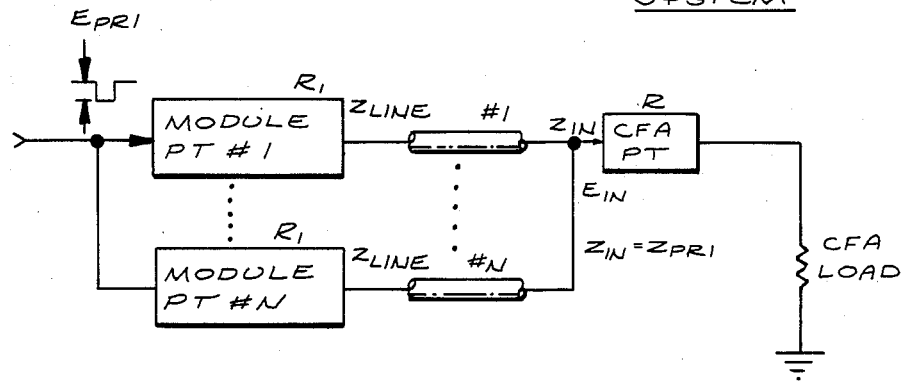
FIG. 3 SIMPLIFIED SCHEMATIC OF MODULAR SYSTEM
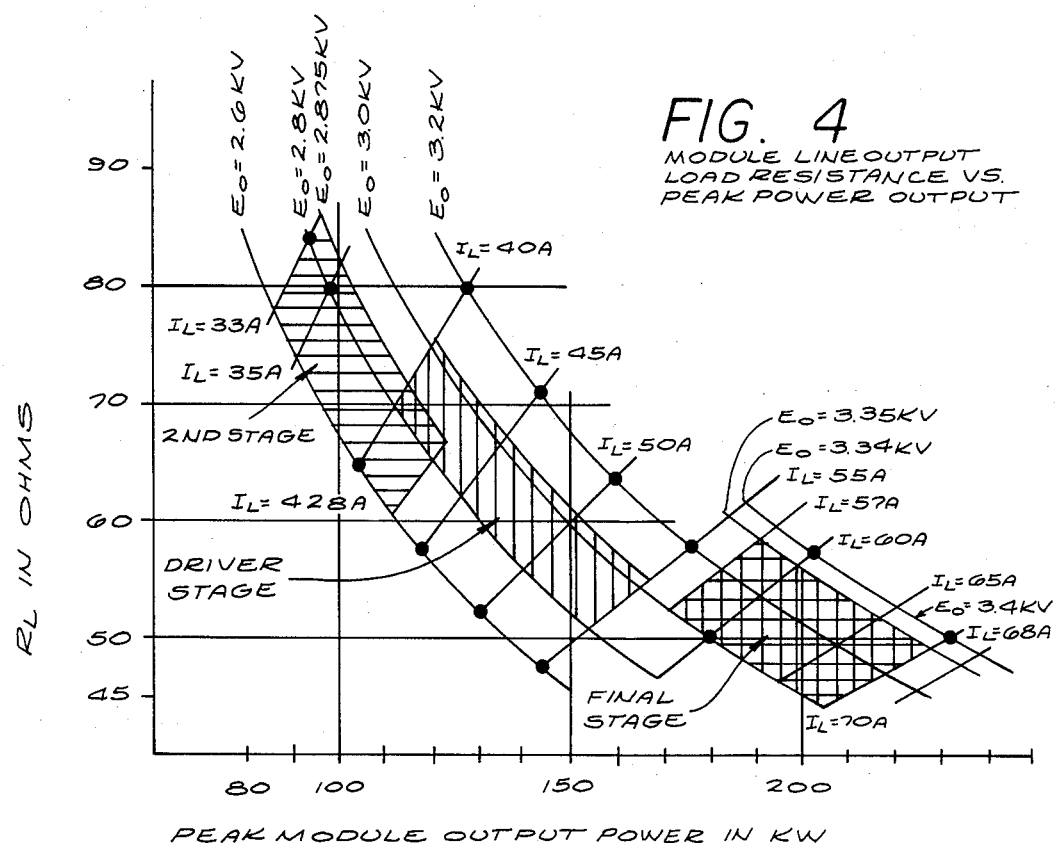
FIG. 4 MODULE LINE OUTPUT LOAD RESISTANCE VS. PEAK POWER OUTPUT

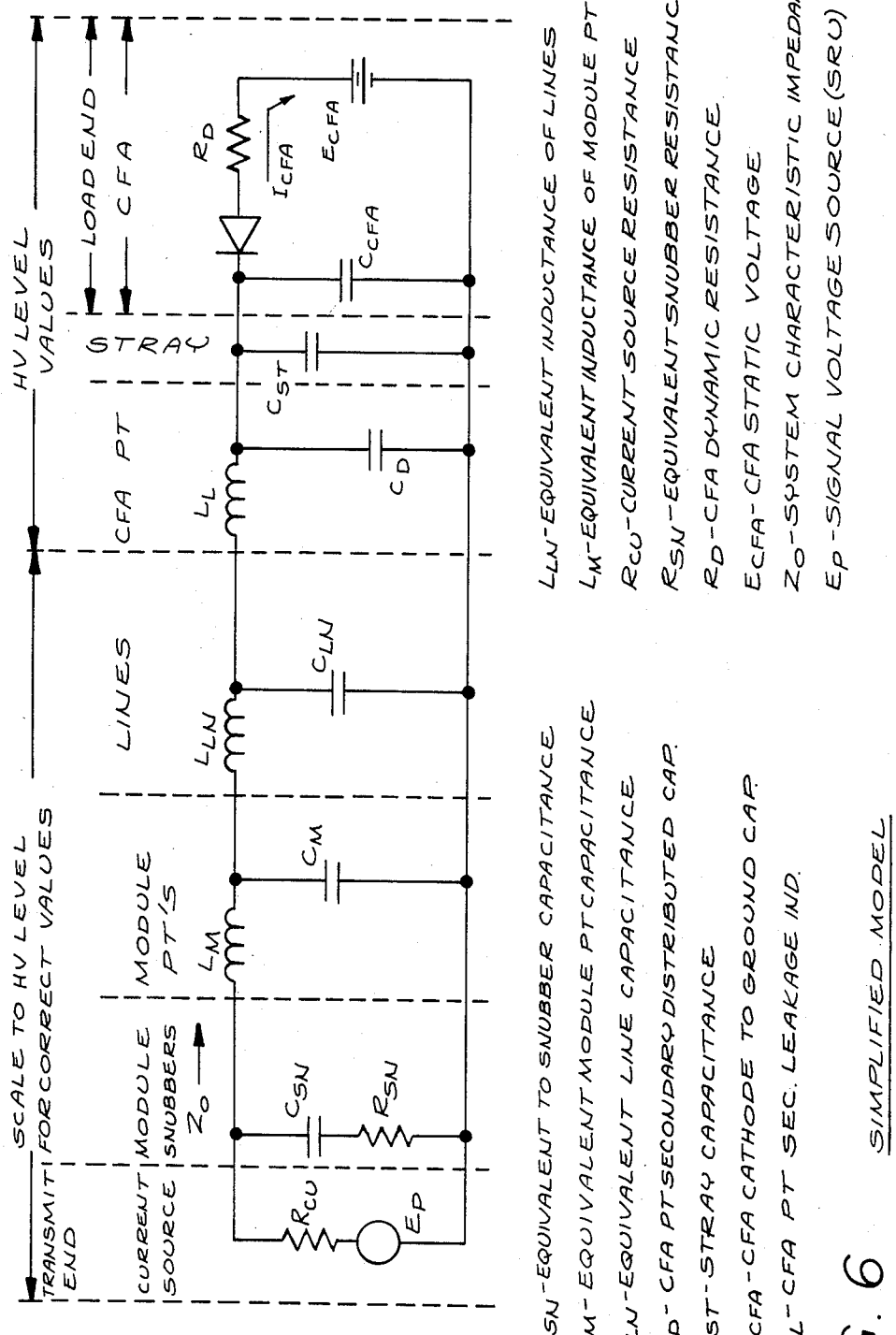
FIG. 6  SIMPLIFIED MODEL

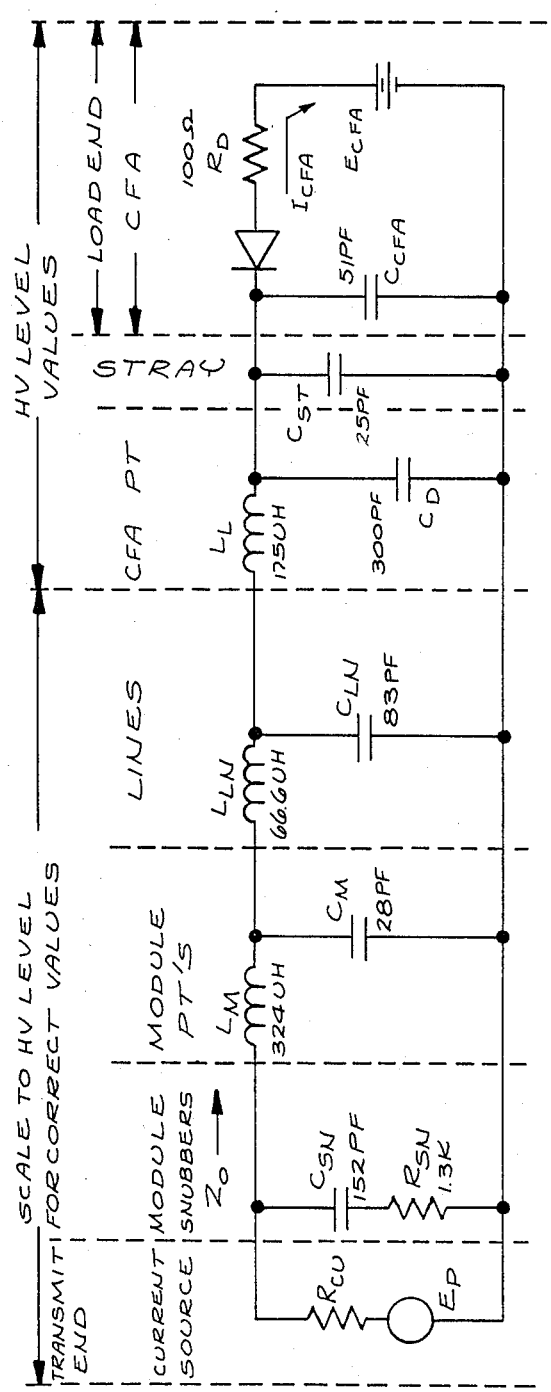
FIG. 6A    SIMPLIFIED MODEL

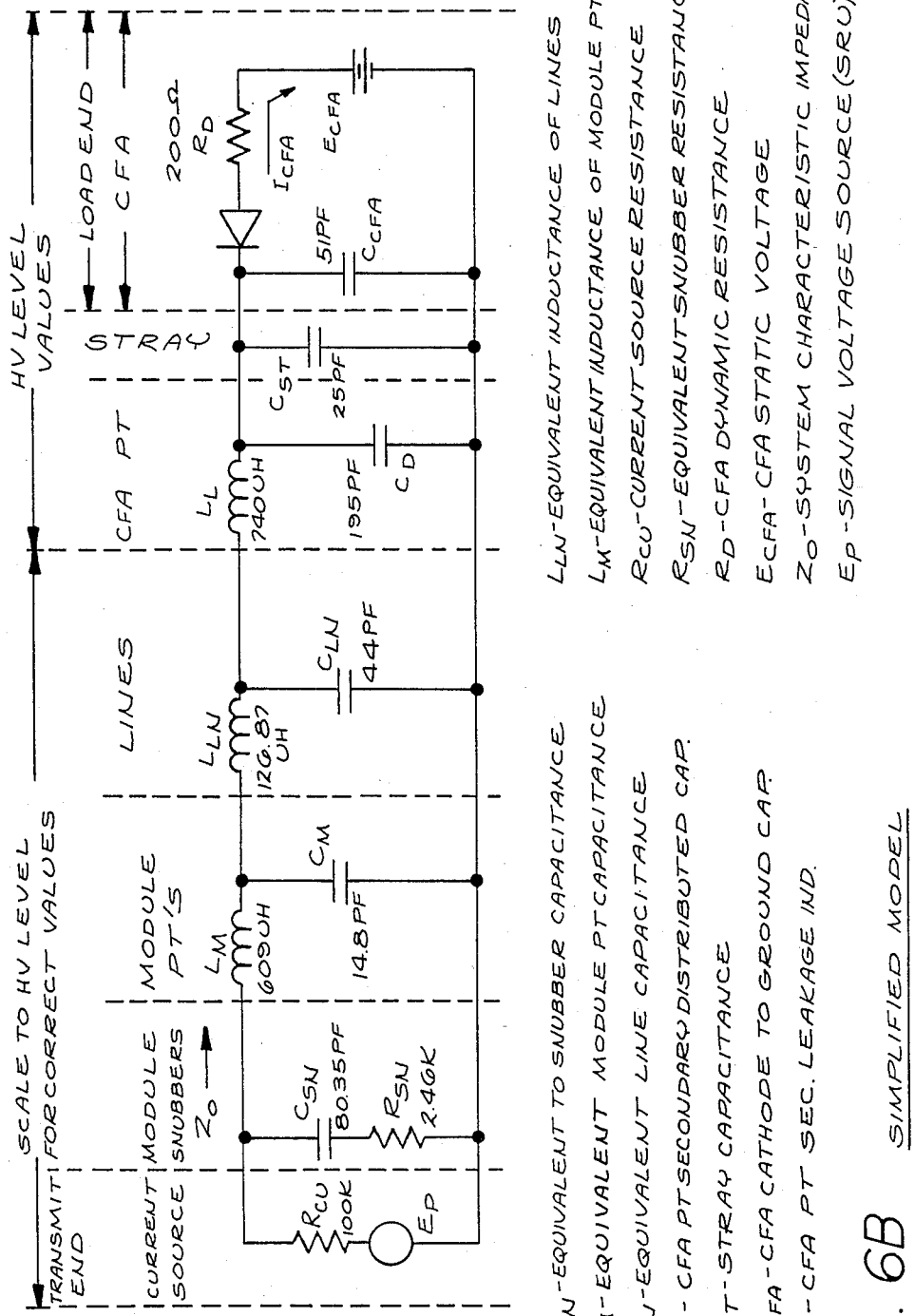
FIG. 6B  SIMPLIFIED MODEL

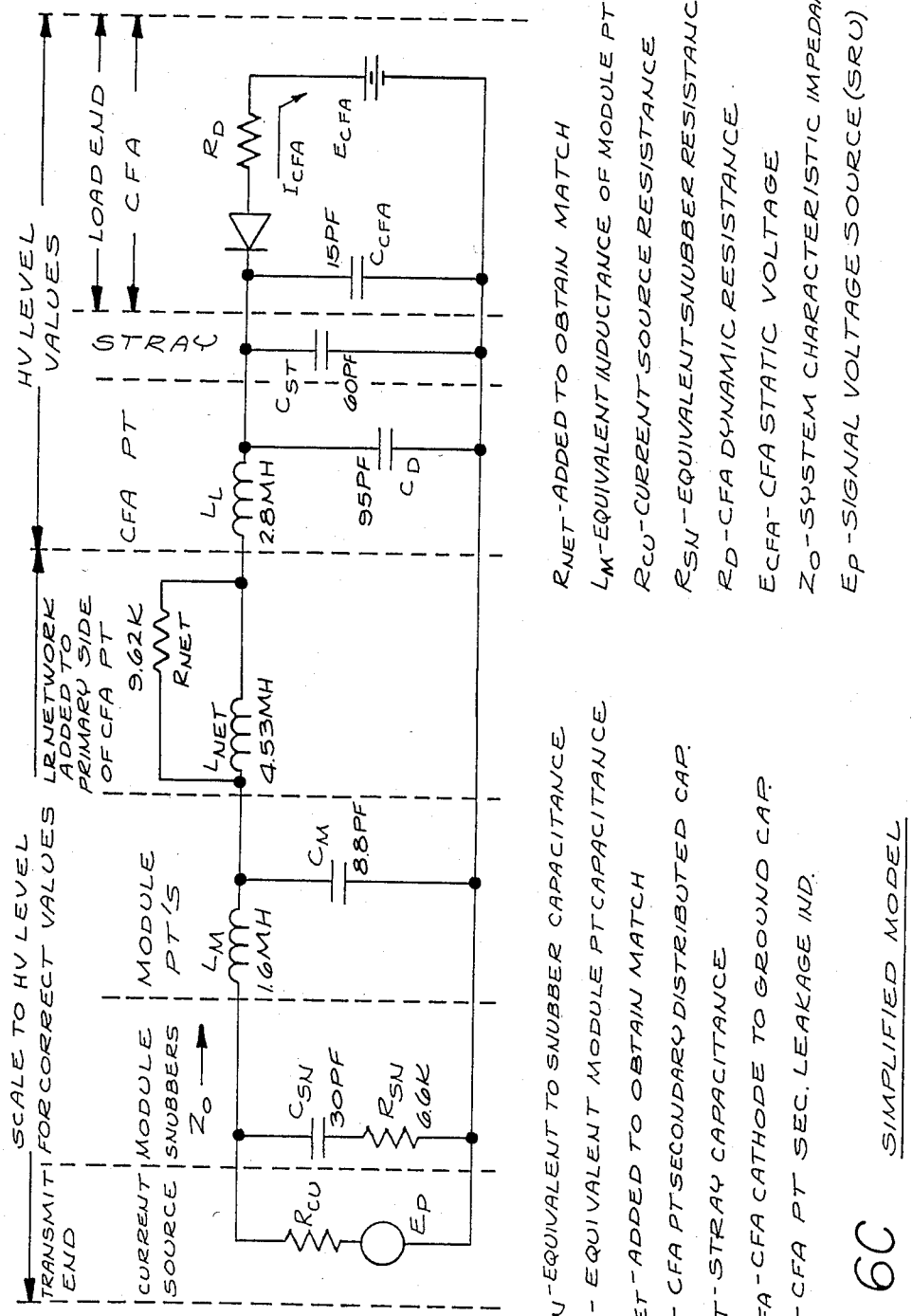
FIG. 6C  SIMPLIFIED MODEL

SRU SIMPLIFIED SCHEMATIC

SRU WAVEFORM TIMING DIAGRAM

SRU SWITCH VOLTAGE WINDOW

HIGH AVAILABILITY SOLID STATE MODULATOR FOR MICROWAVE CROSS-FIELD AMPLIFIERS

The Government has rights in this invention pursuant to Contract No. N00024-83-C-7136 awarded by the Department of the Navy.

BACKGROUND OF THE INVENTION

1. Field of the Invention

The invention relates generally to pulsed radar systems and more specifically to multi-stage RF cross-field amplifier pulse modulators.

2. Description of the Prior Art

In the radar field, two fundamental pulse transmitter configurations are extant, one involves a pulsed microwave oscillator RF generator, such as the familiar magnetron, and the other involves a low power frequency programmed generator and a plurality of microwave power amplifiers successively boosting the RF power to the desired output level. Each stage in the latter configuration must be separately and synchronously pulse modulated and it is this arrangement to which the combination according to the invention relates.

The common prior art of power pulse modulators for microwave RF generators includes the so-called line-type modulators and hard tube modulators. Line-type modulators are simple and usually involve the charging and switched discharge of an artificial transmission line to provide a high power modulation pulse at high peak voltage. Such line-type modulators are typically used to drive the magnetron oscillator aforementioned.

This line-type modulator is limited in its capability and flexibility in that the modulation pulse width is determined by the line itself and is therefore fixed. Moreover, parasitic circuit elements and responses are difficult to control and can impact pulse fidelity if the line (pulse forming network) is not located in close proximity to the pulse transformer through which the pulses are applied to the corresponding RF generator.

Still further, a line-type modulator is basically a voltage source, as that term is understood in this art, whereas, for CFA transmitters, a current source produces much better CFA performance.

Some type of pulse amplitude regulation must be provided for the output pulses of a line-type pulse modulation for pulse-to-pulse consistency of frequency generated by a pulsed mangetron, for example. Such consistency is necessary to achieve stabilities on the order of 40 to 50 decibels for associated MIT (moving target indicator) circuits. Although the line-type modulator is relatively power efficient per se, overall power efficiency of a line-type pulse modulator system considering line charging and amplitude regulation, may be as low as fifty percent.

The so-called hard tube modulator is initially simple and straightforward in that it utilizes a large transmitting type vacuum tube as a switch controlled by grid pulsing circuits. Such an arrangement may be characterized as a "brute force" approach which simply switches the power source to the RF generator as a load during the pulse time as determined by the corresponding grid pulsing.

The large vacuum tube required by a hard tube modulator consumes substantial filament (heater) power and usually requires forced air cooling. The grid-pulser must float below ground at the cathode potential of the switch tube, and a screen supply must be provided if the large vacuum tube is a tetrode. Further design complication results if a feedback circuit is provided to raise the dynamic output inpedance of the modulator.

Although the hard tube modulator is pulse width and repetition frequency agile, its efficiency and reliability are less than optimum and fail-soft features cannot be incorporated. The high voltage power supply required is also a significant disadvantage.

A radar system text of use for overall background in this art is the book "Radar Handbook" by Merrill I. Skolnik (McGraw Hill 1970).

The manner in which the invention addresses the modulator requirement for a multi-stage CFA transmitter will be understood as this specification proceeds.

SUMMARY OF THE INVENTION

In consideration of the prior art in radar transmitter pulse modulator systems, it may be said to have been the general object of the invention to provide a 100% solid state high reliability modulation pulse generator not requiring a high voltage power source. The modulator according to the invention is basically a current source rather than a voltage source and accordingly the CFA microwave amplifiers, for which it was specifically developed, are more effectively and efficiently pulsed than would otherwise be true.

The use of a plurality of identical current pulse generators in the form of standardized, replaceable modules connected in output parallel provides an obvious economy of manufacture. Moreover, this arrangement facilitates achievement of a high order of reliability in terms of MTBF (mean time between failures). A failed module or portion thereof is effectively isolated from the output current pulse buss and a feedback circuit appropriately increases the power level contributed by each remaining module in response to sensing of the modulation pulse amplitude supplied to the corresponding pulse transformer. This operation is referred to as a "fail-soft" implementation.

The aforementioned modules, being implemented in solid state, require only nominal operating voltages, the necessary high voltage pulse to the CFA cathode being provided by feeding the module current pulses to a pulse transformer primary winding for step-up to a typical CFA cathode pulse voltage.

The low level RF pulse circuits may be solid state circuits, and in one typical implementation of the novel combination a first level CFA driven by a single pulse module receives the RF pulses therefrom and amplifies them to drive the modulator pulse. The modules themselves include pulse transformers, the outputs of which are current summed and applied to a CFA pulse transformer. Thus, there is pulse voltage staging within the modulator structure.

The solid state modulator according to the novel combination achieves high efficiency and pulse width agility. In a representative embodiment, a very high power transmitter was involved employing a solid state first stage RF pulse amplifier, a 60 KW (peak) second stage CFA, a third stage (driver) producing a 500 peak watt RF pulse output and a final CFA stage providing 2 to 2.5 megawatt RF power pulses to a frequency scanned, phased array, antenna system. Thus accommodation of variable RF frequency throughout the CFA chain is a requirement as is the requirement for handling RF (and therefore modulator pulses) varying from 5 to 35 microseconds in duration.

The pulse modulator system according to the invention has the following salient features distinguishing it from prior art line or hard tube type modulators:

1. No high voltage dc supply required.
2. The modulator according to the novel combination comprises a modular design through which the required current pulse power is achieved by paralleling modules as needed. Adding or subtracting modules by switching provided spare module availability for the fail-soft design.
3. Each module provides output pulse power variability in response to a control signal devised through a feedback arrangement responsive to actual CFA power output.

In one representative implementation, the aforementioned nominal CFA final stage RF power output required 17 paralleled modules to provide the required modulator pulse current. The driver stage required 9 such modules and the second stage (lowest CFA stage) required but one module.

In view of the modular system design, the relatively heavy components are conveniently separated into packages manageable by maintenance personnel.

The modular concept employed requires certain novel circuitry to effect dynamic impedance matching between modulation pulse circuitry and the CFA in each stage. The details of this feature of the novel combination will be described hereinafter. Moreover, circuits for protection of solid state components are included. One of these involves the generation of a 4 microsecond over-ride pulse at the beginning of the modulation pulse to allow time for redistribution of charges so that high DV/Dt does not cause solid state switch failure. Another circuit protection measure involves "snubber" circuitry to minimize the effects of high DV/Dt.

Since the high voltage pulse applied to the CFA is generated at relatively nominal voltage it is stepped up in two pulse transformer interfaces, on within each module and another associated more directly with the CFA (maximum modulation pulse power interface), novel means have been provided for prevention of BH curve (in the transformer coves) "walk-up". These and other features will be described in detail hereinafter.

BRIEF DESCRIPTION OF THE DRAWINGS

FIG. 3 is a simplified schematic of CFA—modulator interface.

FIG. 4 is a graph illustrating the relationship between module line output load impedance and peak power output.

FIG. 6 is a simplified generalized model (equivalent circuit) of a typical module circuitry.

FIG. 6A is a model according to FIG. 6 specific to the final CFA stage of a system according to the invention.

FIG. 6B is a model according to FIG. 6 specific to the driver stage of a system according to the invention.

FIG. 6C is a model according to FIG. 6 specific to the second stage of a system according to the invention.

DETAILED DESCRIPTION

Figure 1:
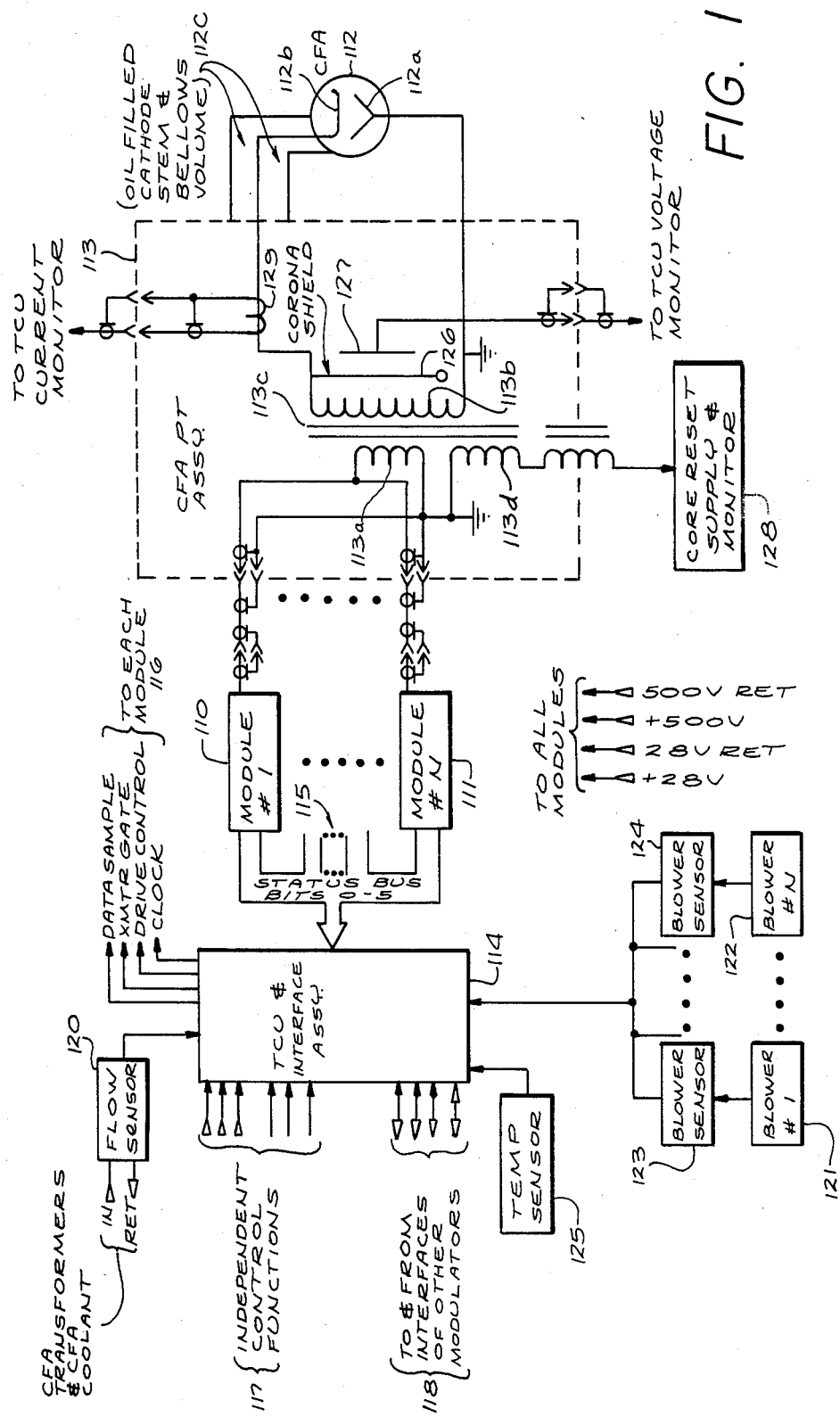
FIG. 1 is a simplified schematic block diagram of one of the CFA units with associated modulator modules and supporting circuits.

Referring now to FIG. 1, the schematic block diagram of a typical multi-module pulse modulator and CFA system is presented. This arrangement may have between 1 and N designated modules typically 110 and 111 depending upon the CFA power demands. In the example implementation aforementioned, the final CFA stage required 17 paralleled modules to provide the needed pulse current, allowing for one or two standby modules to provide the needed pulse current, allowing for one or two standby modules for fail-soft operation. The CFA 112 receives the appropriately powered current pulse through pulse transformer 113. Transformer 113 applies this pulse current from its secondary winding 113b between CFA cathode 112 and anode 112a. The pulse peak voltage therebetween is normally at least 50 kilovolts, depending upon operating frequency. This voltage varies with operating frequency in accordance with a frequency scan program from the basic synthesizer. The core 113c of transformer 113 is a thin continuous magnetic material tape.

The primary winding 113d will be seen to receive the paralleled current pulses from modules 1 to N, and the transformer 113 has a step-up primary-to-secondary ratio of 1 to 17.5, facilitating the generation of the aforementioned (50 KV and up) pulses between the CFA cathode 112b and anode 112a.

Each module such as 110, 111 ect., includes BITE (Built-in test equipment) features for monitoring key electrical parameters therein and coding their values digitally. Those signals are forwarded through a status bus 115 and passed to TCU (transmitter control unit) and interface assembly 114 and are used to monitor and detect malfunctions possibly requiring deactivation of a given module, and also to pass on amplitude adjustment commands to other modules to compensate for loss of a failed module.

Leads represented at 116 are signal paths for synchronization gates to pulse the modules contemporaneously, from TCU 114, those signals being conventionally generated and applied. The lead group 118 contains signal paths to convey test, power level and deactivation commands to modulators corresponding to other CFA stages. The lead group 117 represents operator control options.

The RF connections to the CFA stages and to the antenna are not shown, but are well understood in this art. The antenna is also not shown, but can be presumed to be a phased array adapted for frequency scanning. Accordingly, the required RF frequency program is generated externally and is supplied to the lowest level RF amplifier prior to the cascaded CFA chain.

The higher power CFA stages are normally liquid cooled, as is the highest powered pulse transformer 113 associated with the final CFA stage. A liquid coolant system would include a flow sensor 120 to detect inadequate coolant flow and interrupt operation accordingly. Many other solid state components are associated with heat sinks having substantial thermal inertia and blower type cooling particularly associated with each module is provided, typically represented at 121 and 122 with associated sensors 123 and 124 for interrupting operation in the event of blower failure. A temperature sensor typically represented by 125 may be applied to liquid and air cooled assemblies for similarly interrupting operation whenever abnormal temperature rises threaten equipment damage.

Clock signals in the signal lead grouping 116 relate to the digital encoding in the BITE circuits.

The CFA 112 is an item of commerce per se and includes an oil filled stem and bellows 112C as an integral part thereof.

The CFA pulse transformer is a state of the art device having an uncut wound core of thin low loss magnetic ribbon. The state-of-the-art pulse transformer includes the previously mentioned secondary winding 113b which steps up the voltage pulse applied to its primary winding 113a. Secondary 113b is fitted with a convention capacitive coupling plate 127 which is part of a capacitive voltage divider providing a pulse high voltage monitoring function and permitting observation, scaling and processing of the signal pulse thus detected.

As previously indicated, two levels of pulse transformer (PT) interfaces are used. The first level matches each module via an output step-up PT to a 50 ohm coax line which terminates (on the load end) at the primary winding of the main CFA interfacing PT. All other module outputs in the system are parallel connected, via their respective output lines at this same point. The main PT, which is the second interface, matches the CFA to the modules. This system architecture allows for electrical and locational (physical) flexibility for the designer and the user. Fifty (50) feet of RG/214U (50 ohm) coax has been used to deliver as much as 225 KW of peak power per line without waveform degradation, facilitating the physical separation of the module assembly and CFA itself.

In order to optimize the size of pulse transformer 113, a technique known for the purpose of employed. A magnetic bias winding 113d is provided. Through a source of core bias current 128, a current is applied to winding 113d to produce a magnetic flux in core 113c in the opposite sense vis-a-vis that which will result from pulses on primary 113a. Thus magnetic flux density passes through zero when the primary 113a is pulsed on its way to a maximum value. This provides a core flux excursion which is double that resulting from zero start flux.

CFA pulse current is monitored by current transformer 129 and supplied to TCU 114 for generation of appropriate module feedback control signals.

Figure 2:
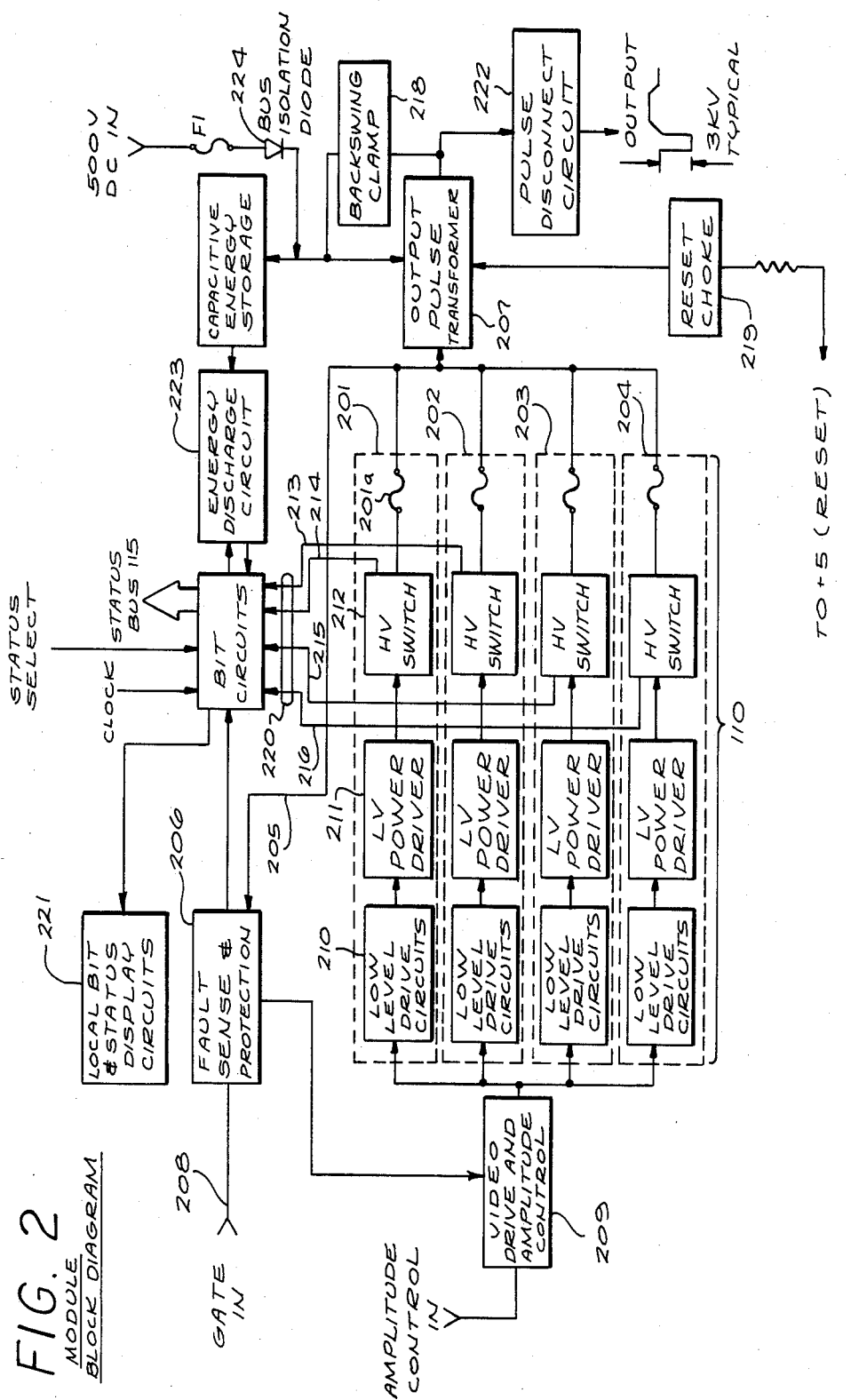
FIG. 2 is a detail of a module or LRU (Line replaceable unit) according to FIG. 1.

Referring now to FIG. 2 a typical module, 110 for example, is depicted.

FIG. 2 further develops the FIG. 1 arrangement and in fact is a diagram of a module 110 (LRU or line replacement unit) with the typical four SRUs (shop repairable units or sub modules) 201, 202, 203 and 204 in place. These SRUs are identical units, each feeding substantially the same pulse current (one fourth of the LRU total) to the bus 205. Each SRU (sub-module 201 through 204) comprises low level driven blocks 210 and 211 and a solid state switch 212. The leads 213, 214, 215 and 216 compared against bus 205 provides a measure of the voltage existing across each HV switch 212 and BIT circuits 220 digitize these values for determination of excessive voltage which could damage any HV switch 212. Block 206 is controlled to compress pulsewidth when HV switch 212 is outside of a predetermined window.

The functions of the elements of FIG. 2 are summarized in the table below. Their precise form will be obvious to those of skill in this art from an understanding of functions and inter-relationships.

| Functional Summary - FIG. 2 | |
|---|---|
| Circuit Block Diagram Identification (FIG. 2) | Functional Description |
| Fuse F1 | Disconnects module from the high energy power source in the event of a short circuit fault within the module. |
| Capacitive Energy Storage 217 | Filters 500 VDC bus and supplies the high peak pulse current. |
| Output Pulse Transformer 207 | Sums currents from the four SRUs on the primary side, and transforms the pulse power to voltage and current levels that can be managed by a 50 ohm coax line. |
| Backswing Clamp 218 | Clamps the secondary backswing to the high voltage dc bus. |
| Reset Voltage, Resistor, and Reset Choke 219 | Provides static and dynamic reset for the output pulse transformer core. Choke restricts magnetizing current of PT. |
| Shop Repairable Unit (SRU) A SRU is made up of the three major blocks and a fuse that are subsequently defined below 201 202 203 204 SRU Fuse 201a (typical) | There are a total of four SRUs per module. The output current from each is summed via a fuse at the primary of the output pulse transformer. Each SRU operates in linear mode. Disconnects SRU in the event of a short, thus, allowing the remaining SRUs to continue operation (fail soft). |
| HV Switch 212 | Power amplifier part of SRU. Consists of four parallel connected HV Darlingtons operated in linear mode, grounded base configuration. |
| LV Power Drive 211 | Drives the HV switch. Consists of two power FETs, and each drives two emitters. |
| Low Level Drive 210 Circuits | Processes the video drive pulse. These, in conjunction with the LV power drive, determine the SRU transfer function (in |

Functional Summary - FIG. 2 (continued)

| Circuit Block Diagram Identification (FIG. 2) | Functional Description |
|---|---|
| | amperes per volt). |
| Video Drive and Amplitude Control 209 | Determines amplitude of the video pulse which drives the SRU assemblies. This unit has a transfer function of video pulse volts out per dc control volts in. The control input is supplied from the transmitter control unit (TCU). |
| BIT Circuits 220 | Senses operational status throughout the module. When the module is enabled, status data is placed on the status bus and transferred to the TCU. |
| Local BIT and Status Display Circuits 221 | Provides LED status indication. |
| Fault Sense and Protection 206 | Monitors a preset voltage window. Compresses pulsewidth when voltage across HV switch is outside of window. |
| Pulse Disconnect Circuits 222 | Disconnects output line from module under certain fault conditions: e.g., when fuse F1 has opened, or if all four switches have failed. |
| Energy Discharge Circuit 223 | Provides controlled discharge of storage capacitors when equipment shutdown occurs - for personnel safety. |
| Bus Isolation Diode 224 | Isolates stored energy between modules in a multi-module system. |

FIG. 3 illustrates the modulator system according to the invention in very simplified form to facilitate development of basic equations focusing on the CFA PT primary driving point impedance $Z_{in}$.

In the following analysis, losses are ignored as of no substantial significance.

Assume that $Z_L$ (CFA as a load) and $Z_{line}$ are fixed. Turns ratio of CFA PT is defined as R, where $$R = \frac{N \text{ secondary}}{N \text{ primary}}$$

$Z_{in}$ can then be written as $$\frac{Z_L}{R^2} \text{ and } N = \frac{Z_{line}}{Z_{in}}$$

Combining these relationships, $$N = \frac{Z_{line}R^2}{Z_L} \quad R^2 = \frac{NZ_L}{Z_{line}} \text{ or } R = \left[\frac{NZ_L}{Z_{line}}\right]^{\frac{1}{2}}$$

For N modules lines driving the impedance $Z_{in}$, each line looks into an impedance given by $Z = NZ_{in}$.

Z is the impedance that each module line sees at the CFA PT primary. For ideal matching, one should make $Z = Z_{line}$; however, this is not the case in the real world. Because N can vary as much as 25% and $Z_L$ can vary by as much as 15%, a compromise value for R must be selected.

For each module $$PO_{mod} = \frac{E_o^2}{Z_o}$$

Assuming that $Z_o$ is resistive $$E_o = R_1 E_{pri}$$

Where $R_1$ is the module PT step-up ratio.

Substituting $$PO_{mod} = \frac{(R_1 E_{pri})^2}{Z_o}$$

Solving for $R_1$ $$R_1 = \frac{(P_o Z_o)^{\frac{1}{2}}}{E_{pri}}$$

$R_1$ is set for 1:7.28 step up.
R is set as follows:

| 2nd State | Driver State | Final Stage |
|---|---|---|
| 1:9.52 | 1:17.45 | 1:17.5 |

The driving point impedance as seen at the primary of each module PT is $$Z_{mod} = \frac{Z}{R_1^2} = \frac{(N) Z_{in}}{R_1^2}$$

For the values chosen, $Z_{mod}$ is on the order of about 1.0 ohms.

The impedance as seen at the end of each module line versus module output power is shown in self explanatory FIG. 4, for the second, driver and final stages, i.e., the CFA stages. The term I is peak module line current. This graph shows the impedance extremes over which the module must operate when the CFA variances and the fail-soft conditions are considered.

Figure 5:
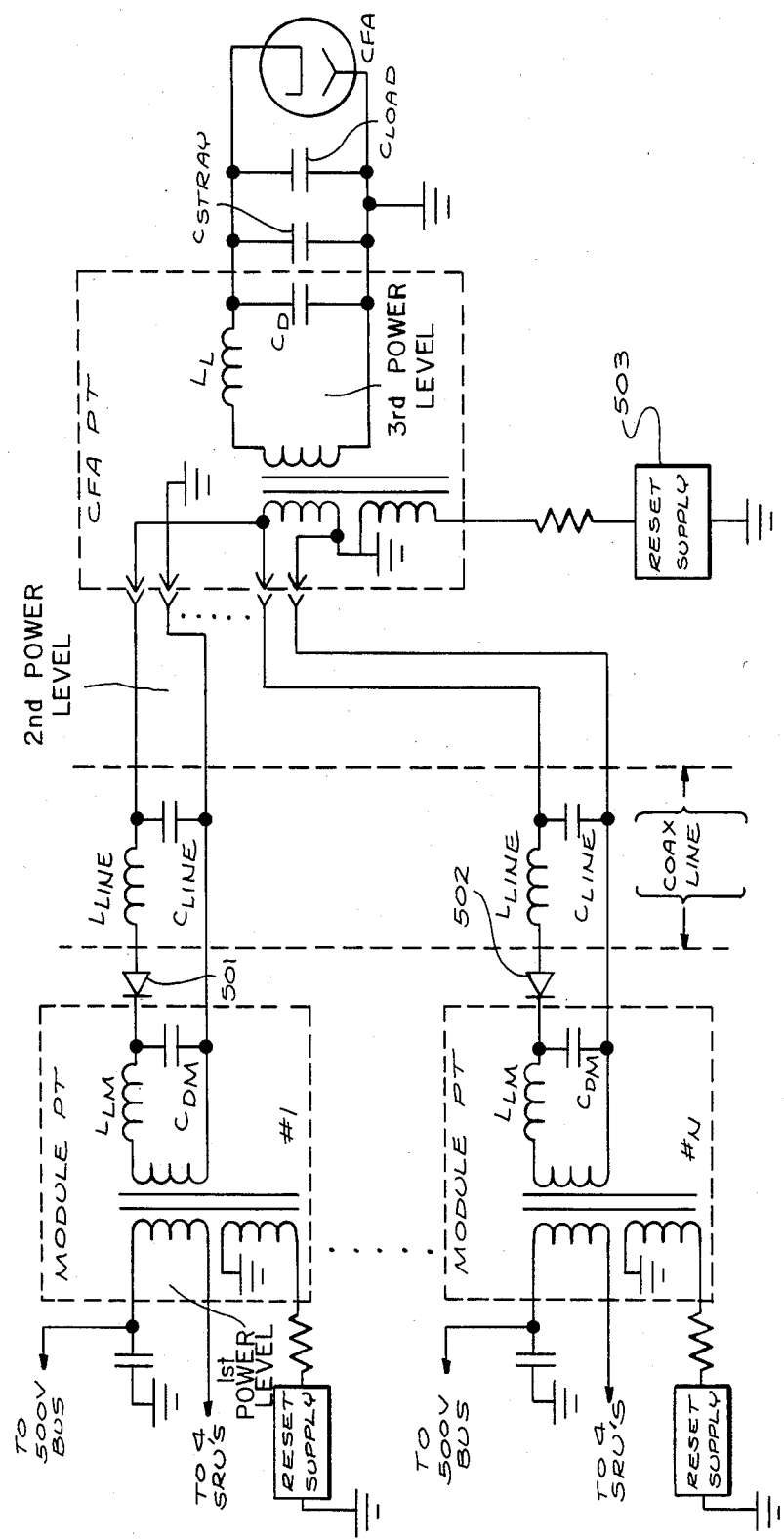
FIG. 5 is a simplified schematic of the module output interface with one of the CFA units.

FIG. 5 is a simplified schematic of a multimodule modulator system, emphasizing the parameters which set the transient characteristics impedance. The basic major parameters are as follows: (1) module PT leakage inductance, $L_{LM}$, reflected to the module PT secondary, (2) module PT secondary distributed capacitance, $C_{DM}$, (3) equivalent line inductance, $L_{Line}$ (4) equivalent line capacitance, $C_{Line}$, (5) CFA PT leakage inductance reflected to the CFA PT secondary, $L_L$, (6) CFA PT secondary distributed capacitance, $C_D$, (7) CFA stray socket capacitance, $C_{Stray}$, (8) cathode to ground capacitance, $C_{Load}$, and (9) the CFA. This schematic (FIG. 5) is an interim step to the obtaining of the model shown in FIGS. 6, 6a, 6b and 6c.

FIG. 5 also shows a line isolation diode (501 and 502) in the output lines of each module. In order for the core of a pulse transformer to reset properly the reverse volt seconds must equal the forward volt seconds. Because the forward volt seconds of the module PT is not quite the same as that of the CFA PT, due to a slight amount of line loss, the CFA PT recovers first. If it were not for the isolation diode, the reverse volt seconds on the module PTs would be prematurely terminated. Then, successive pulses would cause the module PT cores to "walk up" their respective B—H curves and saturate, thus, causing the system to malfunction. It is recognizable that the reverse recovery characteristics of diodes are not ideal, however, any slight imperfections are covered by the static DC reset from the reset power supply 503. In addition to isolating the reverse volt seconds of the CFA PT, the diodes also isolate slight differences in reverse volt seconds from module to molule. FIGS. 6, 6a 6b and 6c are largely self-explanatory, illustrating the impedance matching architecture as identified.

Figure 7:
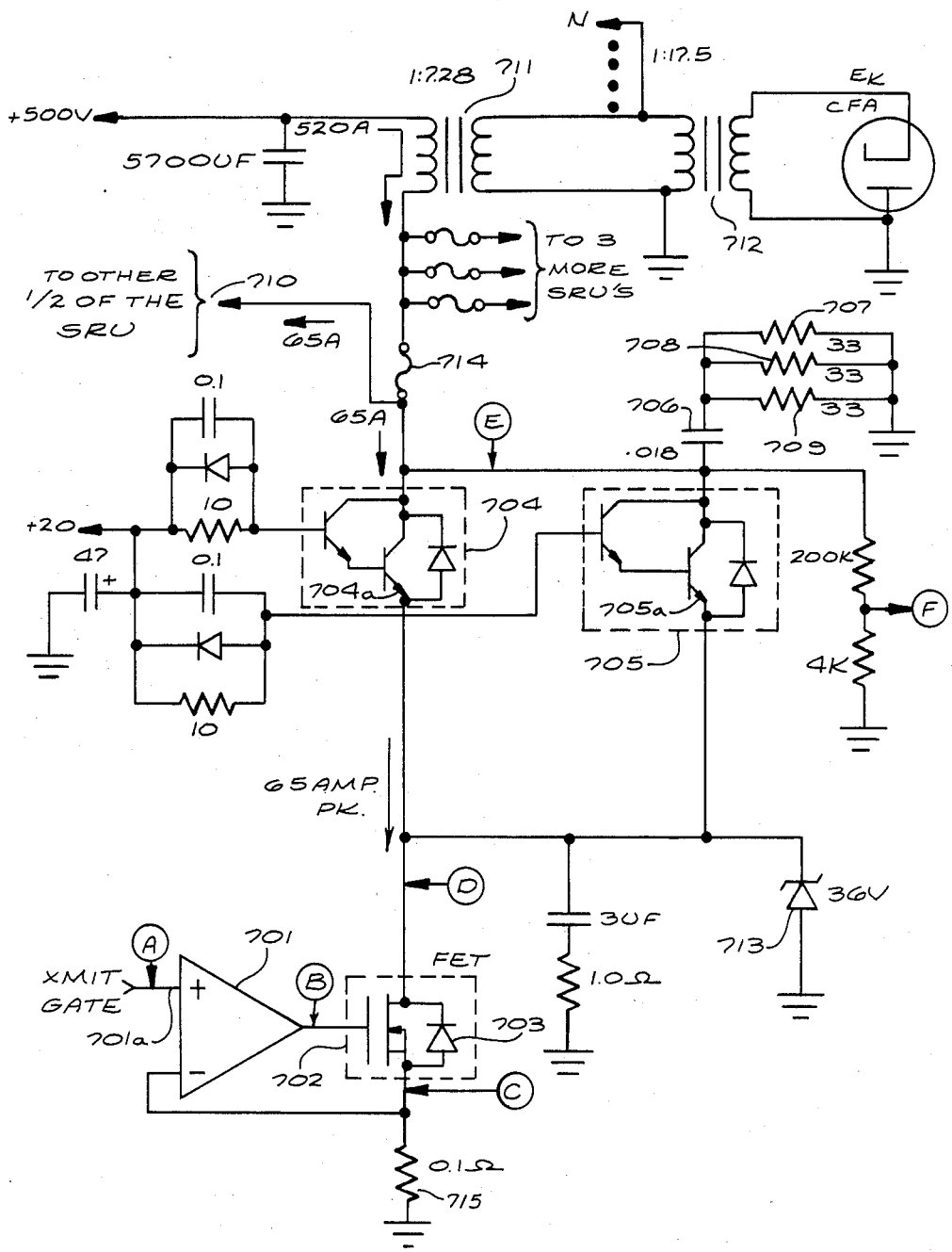
FIG. 7 is a simplified SRU schematic diagram.

Referring now to FIG. 7, the SRU units are further described. FIG. 7 shows one half of an SRU such as 201, 202, 203 or 204 from FIG. 2. The HV switches (typically 212 from FIG. 2) comprise a pair of Darlington transistors 704 and 705, together producing a current pulse of 65 amp. in the embodiment described. The other half SRU would join the current pulse bus at 710 adding another 65 amp. peak to the current pulse. Since four such SRUs are contemplated per LRU (module), the total pulse peak current is (4) (65)(2)=520 amp. peak into the SRU pulse transformer 711. This current pulse is boosted in voltage and at the secondary of transformer 711 is fed into the CFA pulse transformer 712.

At 701a, the gate which represents the modulation pulse at low level is applied to an amplifier 701, the output of which is applied to a high power field-effect transistor (FET) 702 having a diode 703 across its current carrying path. The FET output controls the emitters of the Darlingtons as shown. Feedback from a resistor 715 of small ohmic value is applied as shown to the amplifier 701.

A Zener diode 713 is arranged to avalanche if either Darlington breaks down, thereby blowing fuse 714 and effectively removing that SRU from the circuit.

Resistors 707, 708 and 709 along with capacitor 706 provide a "snubbing" action, diluting the very high DV/dt otherwise extent at the Darlingtons 704 and 705.

Figure 8:
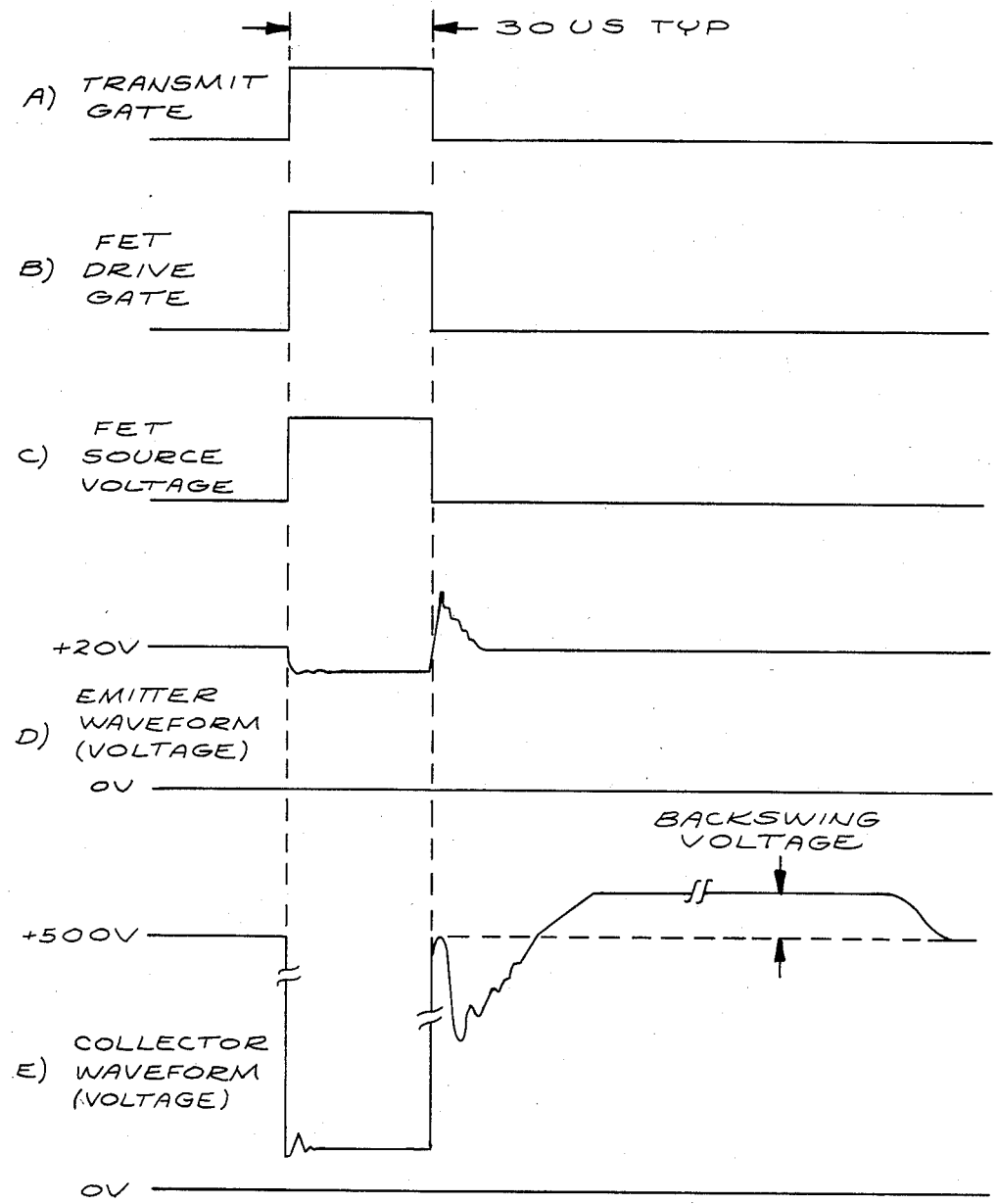
FIG. 8 is a waveform timing diagram corresponding to LRU and SRU normal operation.
Figure 9:
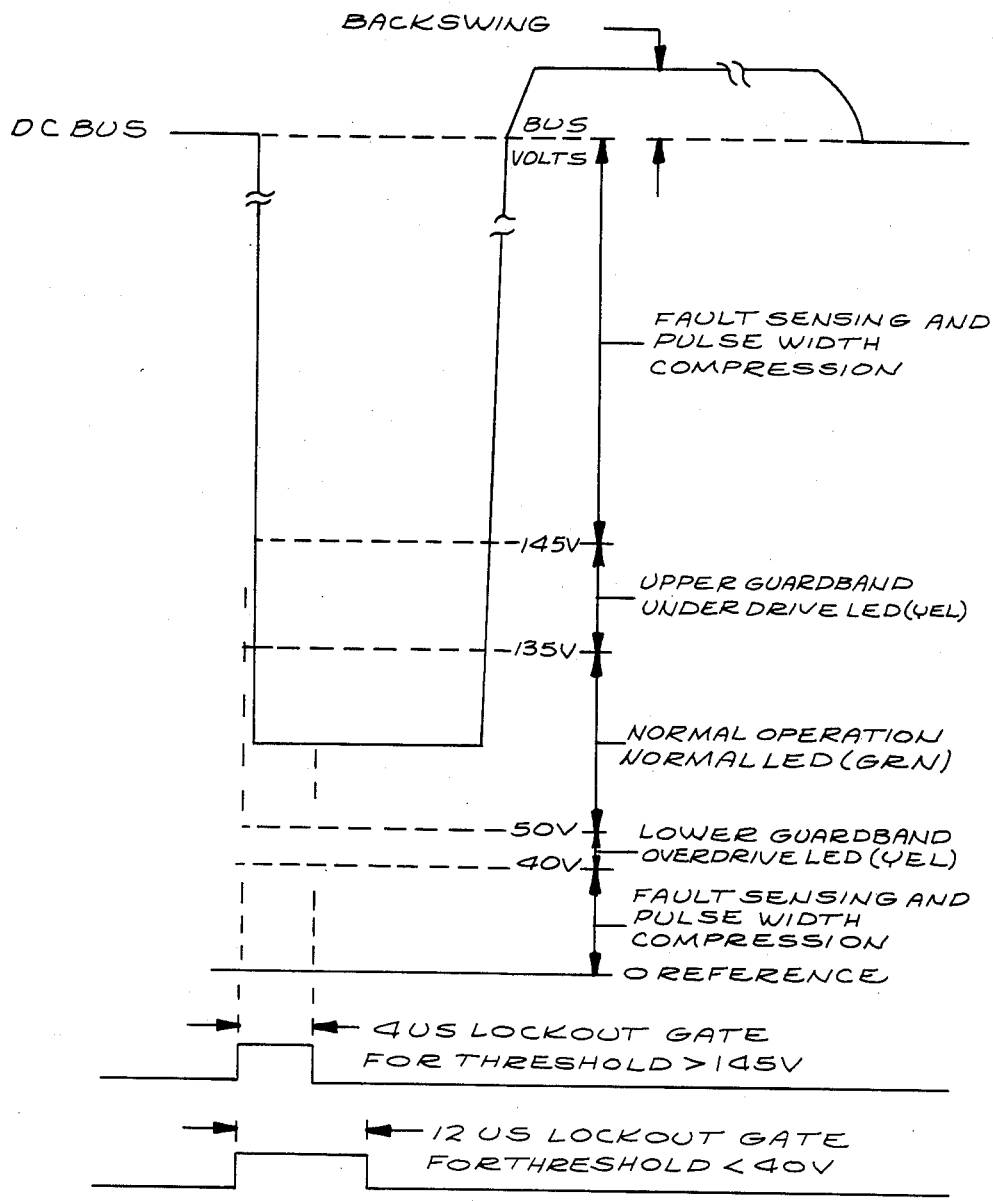
FIG. 9 is a waveform diagram illustrating LRU/SRU switch voltage window.

FIG. 8 depicts the waveforms at indicated points in FIG. 7, and FIG. 9 shows the lockout gate and guard band sensing disclosed in the discussion of FIG. 2. The so-called lockout gate is a nominal 4 or 12, microseconds in duration in accordance with the threshold conditions depicted.

Some additional discussion relating to fault operation follows. Starting with point (A) on FIG. 7, which is the input transmit gate, its amplitude sets the amount of peak output current delivered by the modules. In other words the module has a transfer function of peak amperes out per a predetermined amplitude of gate drive volts in. This value is fixed and controlled by the circuit parameters. Point (B) which is the FET drive gate voltage is merely the sum of $V_{th}+V_{gs}+I_L R_{source}$. Its ultimate amplitude is primarily controlled by the input amplitude of waveform (A). Waveform (C) which is the FET source voltage is determined by the value of the FET drain current and source resistance ($I_L R_{source}$). Typically this value runs about 6.0 to 6.5 volts. This is also the feedback point for the FET drive circuits. Point (D) is the bipolar darlington emitter waveform, and is also the drain waveform for the FET drive transistor. In order for current to flow through a bipolar NPN transistor the base is typically biased positive with respect to the emitter, therefore, when the FET drain voltage pulls down, and the base of the bipolar is held constant at +20 V, the turn on conditions are met and the bipolar transistor conducts. Because the emitter of the bipolar transistor presents a very low impedance to the drain of the FET, the V pull down is very small, typically on the order of two 2 to three 3 volts.

The positive-going spike on the trailing edge of the drain/emitter waveform is the bipolar shut off waveform. When the FET shuts off, the emitter current, which is quite high, shifts over from the emitter to base path in the bipolar transistor. This shuts the bipolar transistor off very rapidly by applying a high reverse $V_{BE}$ cross the bipolar transistor junction. Sometimes, if this voltage is high enough, avalanche of the $V_{BE}$ function takes place. The 36 V Zener diode has been included in this circuit in order to prevent this from happening.

The last waveform in FIG. 8 to be considered is (E), the transistor collector waveform. This waveform is important and a considerable amount about the system performance can be determined from its observation. Therefore, it should be given a special test point on the front of each module. The backswing voltage shown in waveform (E) is really the reverse volt seconds, which must equal the forward volt seconds, in order for the module PT core to reset properly. An expansion on the importance of waveform (E) and how it is used to protect the modulator system will now be discussed.

FIG. 9 is an expansion of the waveform (E) in FIG. 8. In addition, FIG. 9 shows the two lock-out gates. An attenuator senses the collector voltage of the module transistors and attenuates it down to a level suitable for processing by IC operational amplifiers, comparators, and logic circuits. The objective is to hold the voltage across the switch during the pulse time to somewhere between about 50 and 135 volts. When the voltage strays outside of these limits then a warning light lets the operator know that the equipment is operating close to the design margins, and corrective action can be manually taken.

FIG. 7 point (F) shows the output of the attenuator which is applied to four comparators. The scaling of these comparators represents 40 V, 50 V, 135 V, and 145 V respectively as shown in FIG. 9. Because it takes time for the collector voltage waveform to rise, overshoot, undershoot, and settle, the comparators are disabled during this time, thus, a 4 microsecond lock-out blanking gate is applied to prevent erroneous sensing as shown in FIG. 9. After the lock out gate has terminated those sensing circuits will take appropriate action, depending on just where the collector voltage pulse is with respect to ground. If an intrapulse short circuit should develop after the 4 microsecond lockout the collector would rapidly move up towards 500 V rail passing through the 145 V threshold level. As the voltage passes through this threshold the action taken would be as follows: (1) the remaining transmit gate would be truncated in the module, and (2) in addition, the transmit gates to all other modules in the rack would also be truncated via a special bidirectional data bus line. Any module in a rack can initiate truncation of all other modules in the same rack. This feature is provided so that all modules within a rack will turn off synchronously under fault conditions. If it were not for synchronous turn off, the modules to turn off last would try to take the extra load and this would result in destruction of the switches. Under conditions of misadjustment some of the modules pull down to just below the 145 V threshold and the other modules will pull down to just above this 145 V threshold. If it were not for the synchronous turn off line, almost one half of the switches could be lost. It is realized that this example is extreme, however, it is an event which must be anticipated for the sake of reliability.

The 135 V comparator takes no action other than to illuminate an amber colored LED, just to let the operator know that the system operation is close to an underdrive, the upper limit.

The 50 to 135 V window comparator illuminates a green LED. It takes no action other than to let the operator know that the proper voltage exists across the SRU switches.

The 50 V comparator takes no action other than to illuminate an amber LED, when the voltage is less than 50 V and to let the operator know that the system is operating close to an overdrive condition.

The 40 V comparator action is to truncate the pulse after a 12 microsecond lock-out time. In addition, it synchronously turns off all of the other modules in the rack via the synchronous turn off line in the same manner as the 145 V threshold comparator. Again, this is done for the same reasons as in the case of the 145 volt comparator.

In order for a modulator system to be of value it must be able to survive under difficult conditions. In addition to normal operation, there are four basic fault conditions that this modulator must survive which are as follows:

(1) Direct Short Circuit
(2) Intrapulse Short/arc
(3) Open Circuit
(4) Open Circuit arc Because each module is a current source, thus making the entire modulator system a current source, there is no problem with current limiting and overdissipation of the switches. When a short occurs, the collector voltage pulls up towards the 500 V rail passing through the 145 V shut off threshold. Therefore, the on time is limited to something less than 4 microseconds, thus, reducing the short circuit duty cycle well down to within tolerable limits.

Crossfield Amplifiers (CFAs) are famous for arcing during the pulse time; in fact, it happens quite frequently. Because the modulator system is a current source, the fault current increases only slightly over the normal CFA beam current. During this process, again the collector voltage is pulled up towards the 500 V rail passing through the 145 shutoff threshold which terminates the pulse. The additional power dissipated in the collectors while all of this is happening is well within the window of tolerance; so there is no problem with this fault condition.

The open circuit condition occurs usually under two conditions: namely, (1) when the load is left disconnected, or when RF drive is withheld from the CFA making it looks like an open circuit.

When the load is open the collectors voltage on the transistors pulls down to ground past the 40 V threshold point. If the voltage stays below this level the pulse will truncate after 12 microseconds and nothing will happen. The modulator will survive this condition and become ready for the next pulse. However, during the time that the collector voltage is pulling down toward ground the output pulse across the secondary of the CFA PT is heading towards 2 E where E would be the normal CFA cathode voltage. Now, if the 2 E voltage does not arc over the modulator will survive. However, if an arc should take place somewhere between E and 2 E, this produces a different set of circumstances that must be dealt with in a different and more complex manner.

The open circuit arc is usually caused by RF being withheld from the CFA which can and does happen in this system. What happens is that the voltage builds up across the CFA, passes through the normal operating point, heading for 2 E, and somewhere in between E and 2 E the CFA arcs placing a direct short between the CFA PT secondary winding and ground. Under these conditions a high percentage of modulator switches would be destroyed unless something is done to prevent it. In order to prevent this type of failures one must start with a thorough understanding of what is happening as a function of time.

In order to understand the sequence of events one must review some fundamental line theory. If a line is shorted at the load end; the energy is reflected back to the transmit end 180° out of phase. This has been well anticipated by providing a hefty clamp and an electrostatic dump yard to absorb this reflected energy, thus, preventing it from being dissipated in the collectors of the power transistors. However, when the voltage is rising between E and 2 E energy is being reflected back from this line in phase with the signal and drives the switches into reverse conduction; even if the gate has been removed from the drive FET. All of this is taking place before the CFA arcs somewhere between E and 2 E. When the voltage is reversed across the switch the junction charges reverse themselves and set up a condition whereby a reapplied high dV/dt in the forward (normal) direction can kill the solid state switches.

The design approach chosen involves holding the FET gate on for four (4) microseconds regardless of whether or not the input gate terminates early. This solution is mechanized in each module. The timing for the four (4) microsecond pulses is derived from a crystal controlled clock and is very exact for all modules. This is important because all gates must turn off synchronously. In other words the four microsecond gate overrides the early gate terminations and a wider gate, which would be the normal gate, overrides the four (4) microseconds. One system tested arced in this manner 27 times with no failures. Data accumulated on that system shows that the Final CFA was arcing between about 78 KV and 94 KV, within the first two microseconds. Therefore, the 4 microsecond limit hereby set is entirely adequate to cover all CFAs.

It will be realized that various modifications in the detailed instrumentation are possible and accordingly it is not intended that the drawings and this description be regarded as limiting the scope of the invention. The drawings and description are intended to be typical and illustrative only.

I claim:

1. In a radar system including at least one CFA stage and a pulse modulator system therefore operating as a current source, the combination comprising:

first means including a CFA pulse transformer responsive to a current pulse at high power level at its primary winding to produce and apply to said CFA a voltage stepped up to a peak voltage suitable for operation of said CFA;

second means responsive to a low level synchronizing gate signal for successively amplifying the power level of said gate to produce said high power current pulse, said second means comprising at least one module and a plurality of paralleled sub-modules therein, said sub-modules each generating a current pulse as a function of the value of said high power current pulse;

a first pulse transformer responsive on its primary winding to said paralleled sub-module outputs producing said high level current pulse at its secondary winding at a first stepped-up peak voltage level; and a second pulse transformer responsive at its primary winding to pulses from said first pulse transformer secondary winding, the terminals of said secondary of said second transformer being connected to the cathode and anode terminals of said CFA; and impedance matching means inserted between said first transformer secondary and said second transformer primary.

2. The combination according to claim 1 in which an impedance matching network comprising transmission line parameters is inserted between the paralleled outputs of said first pulse transformers and the input to said second pulse transformer.

3. The combination according to claim 1 in which a diode is connected in series with the output of said paralleled first transformer secondaries and said second pulse transformer primary, said diode being poled to pass pulse currents but block the backswing voltages.

4. A modular, high power, high availability pulse modulator for a cross field amplifier RF stage in a radar transmitter requiring agility of transmitted frequency, pulse width, repetition frequency and a degree of fail soft capability, comprising:

a plurality of pulse modules each including a plurality of sub-module pulse amplifying circuits, each responsive to a video frequency synchronizing pulse to produce a first level modulator pulse, the outputs of said sub-modules being paralleled to provide a module output pulse;

a plurality of first module pulse transformers, each of said module pulse transformer having its primary winding connected to receive a corresponding module output pulse;

means for paralleling the secondary output pulses from said plurality of module pulse transformers to produce a combined pulse at a higher second power level;

a second pulse transformer responsive to said combined pulse at said second power level for producing higher third power level pulses to drive said cross field amplifier stage;

fourth means for monitoring the current pulse applied to said CFA and for adjusting the amplitude of said first level modulator pulses to tend to hold said third power level pulse at a predetermined level.

5. The combination according to claim 4 further comprising a diode in series with the output of each of said module pulse transformers, said diodes being poled to pass the pulse output of each corresponding module pulse transformer output thereby to discriminate against back swing signals to prevent the effect of such back swing currents on the secondary of said module pulse transformers and the corresponding pulse transformer core saturation.

6. The combination according to claim 4 in which an impedance matching network is connected in series between said paralleled module pulse transformer secondaries and said second pulse transformer primary to optimize power transfer during pulse conditions.

7. The combination according to claim 4 in which said modules each include synchronously controlled high power solid state current switches to act as power amplifier, and in which a disabling gate having a predetermined duration is applied to said high current switches, said duration, straddling the times of power pulse trailing edges to eliminate the effect of non-synchronous pulse termination in one or more of said solid state switches.

* * * * *